(12) United States Patent
Vähämäki et al.

(10) Patent No.: US 6,646,859 B2
(45) Date of Patent: Nov. 11, 2003

(54) POWER SUPPLY ARRANGEMENT

(75) Inventors: Olavi Vähämäki, Laihia (FI); Tero Talvitie, Vaasa (FI); Kari Rautiainen, Vaasa (FI); Lassi Toivonen, Espoo (FI)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 10/246,725

(22) Filed: Sep. 19, 2002

(65) Prior Publication Data
US 2003/0067736 A1 Apr. 10, 2003

Related U.S. Application Data

(62) Division of application No. PCT/FI01/00315, filed on Mar. 30, 2001.

(30) Foreign Application Priority Data

Mar. 31, 2000 (FI) .............................................. 20000747

(51) Int. Cl.$^7$ .............................................. H01G 4/228
(52) U.S. Cl. ..................... 361/306.1; 361/323; 361/326; 361/328; 361/326.3; 363/90; 363/98; 363/132
(58) Field of Search .............................. 361/306.1, 323, 361/326, 328, 306.3; 363/90, 98, 132, 131, 128, 129

(56) References Cited

U.S. PATENT DOCUMENTS

| | | | | |
|---|---|---|---|---|
| 3,686,483 A | * | 8/1972 | Umahashi | |
| 4,586,121 A | * | 4/1986 | Gilliam | |
| 4,712,170 A | * | 12/1987 | Grace | |
| 4,931,843 A | | 6/1990 | Goetz | |
| 5,001,402 A | | 3/1991 | Milton et al. | |
| 5,361,018 A | | 11/1994 | Milton | |
| 6,044,000 A | * | 3/2000 | Twardzik | |
| 6,097,761 A | * | 8/2000 | Buhring et al. | |

FOREIGN PATENT DOCUMENTS

| | | |
|---|---|---|
| EP | 0 314 850 A1 | 5/1989 |
| JP | 7250442 A | 9/1995 |

* cited by examiner

*Primary Examiner*—Dean A. Reichard
*Assistant Examiner*—Nguyen T. Ha
(74) *Attorney, Agent, or Firm*—Oliff & Berridge, PLC

(57) ABSTRACT

A power supply arrangement, especially in connection with a conductor (5) of a medium-voltage overhead line, which arrangement comprises a power supply (2) and a first and second element (3, 4) made of an electrically conductive material, which are connected electrically to the power supply for feeding energy to the power supply. The first element (3) of the power supply arrangement is arranged to be close to the conductor (5) and has a capacitance (Ce) to an element in a second potential, the capacitance being arranged to charge itself by effect of an electric field generated by the voltage of the medium-voltage conductor, and said second element (4) is arranged to have a galvanic or capacitive connection with the conductor (5) for feeding energy to the power supply (2) from the potential difference between said first and second elements.

9 Claims, 3 Drawing Sheets

POWER SUPPLY ARRANGEMENT

This application is a Continuation of International Application PCT/FI01/00315 filed Mar. 30, 2001 which designated the U.S. and was published under PCT Article 21(2) in English.

BACKGROUND OF THE INVENTION

The present invention relates to a power supply arrangement, especially in connection with a conductor of a medium-voltage overhead line, which arrangement comprises a power supply and a first and second element made of an electrically conductive material, which are connected electrically to the power supply for feeding energy to the power supply.

For a reliable transfer and distribution of electric energy, it is important that the quality of the transferred energy can be monitored in a reliable manner. For this purpose, the voltages and currents of transmission and distribution lines are measured, whereby possible fault situations, for instance, can be detected and located. It is known to position wireless sensors measuring the current and voltage of conductors on overhead lines, which sensors transmit the measuring information over a radio link to a receiver which interprets the measuring information and possibly forwards it on.

Supplying energy to such wireless measuring sensors has conventionally been done by using batteries as the voltage source. A weakness in such an arrangement is that the batteries must be replaced at regular intervals. It should be understood that changing the batteries of a device connected to a medium-voltage conductor is very arduous and dangerous with respect to safety, since such conductors are typically located at a height of approximately 10 m and their voltage to ground is 6.9 to 21 kV. In addition, the lines are often completely uninsulated or only lightly insulated.

A second known power supply method for wireless measuring sensors in medium-voltage conductors is to utilise the magnetic field generated by the current running in the medium-voltage conductor. Such a method is disclosed in published EP patent 0314850 B1. The publication describes, how an overhead line is used as a primary coil of an iron-core transformer, whereby the required voltage for using the measuring sensor is obtained through a secondary coil of the transformer mounted on the line. A weakness in such a method is that voltage is obtained for the wireless device only when current runs in the conductor. In other words, it is impossible to measure the electric properties of a conductor which has a voltage but no current using the device of the publication. A situation in which a line has a voltage but no current arises for instance when the switching device of the line is opened. In such a case, there is a voltage on the supply side of the switching device, but it cannot be detected by the arrangement described in the publication. Determining the voltage of a currentless line is necessary for instance for monitoring reconnections or the voltage of line sections on both sides of an opened switching device.

JP publication 7250442 A discloses a power supply arrangement connected to a steel tower of a transmission line. The arrangement of the publication is based on a metal plate located in the electric field of the transmission line and having a capacitance to the transmission line. Then when the capacitance charges itself, a potential difference is formed between the metal plate and ground potential. This type of solution thus only functions with towers supporting metal conductors. In addition, in such an arrangement, fixed installations to the tower are necessary, and thus it is not suitable for use as a power supply in devices mounted directly to the conductor.

U.S. Publication 4,931,843 discloses a capacitively connecting voltage sensor which also has a voltage tapping point connected to it for supplying power to a low-power device. In this solution, the voltage tapping point is implemented by a strong capacitive connection from between a metal object connecting to a high-voltage conductor and ground potential. The solution thus requires grounding the sensor galvanically to generate said voltage.

U.S. Publication 5,001,402 discloses an arrangement for burning neon lamps arranged to high-voltage conductors. Generating voltage for said lamps is implemented capacitively in such a manner that one electrode of the lamp is galvanically connected to the high-voltage conductor and the second electrode is connected to a metal surface formed by a capacitive connection. The lighting and burning of the lamps require that the lamps be located in a high electric field and in addition, the lamps should be located so that a parallel capacitance is formed beside them.

BRIEF DESCRIPTION OF THE INVENTION

It is an object of the present invention to provide a power supply arrangement which avoids the above-mentioned drawbacks and enables the supply of electric energy to the power supply of the arrangement as a unit arranged to a live medium-voltage conductor. This object is achieved by an arrangement of the invention, which is characterized in that said first element is arranged close to the conductor and has a capacitance to an element in a second potential, the capacitance being arranged to charge itself by effect of an electric field generated by the voltage of the medium-voltage conductor, and that said second element is arranged to have a galvanic or capacitive connection with the conductor for feeding energy to the power supply from the potential difference between said first and second elements.

The power supply arrangement of the invention is based on the idea that the energy for feeding the power supply is directly obtained through the ground capacitance of a device suspended from the medium-voltage conductor or possibly through some other capacitance. The current running through the ground capacitance of the device connected to the conductor is then utilised to feed other electronics of the device. The arrangement of the invention provides considerable advantages over prior art. When the arrangement is connected to a medium-voltage conductor, it is a completely maintenance-free functional unit as regards voltage supply, in other words, it does not contain replaceable parts, such as accumulators or batteries. Thus a device containing the arrangement, such as a sensor defining the properties of a conductor, need not be removed from the conductor after it has been mounted there.

In addition, to generate energy, the arrangement of the invention only requires a conductor having a voltage, to which it is connected. That is, the conductor does not necessarily need to have a current. This is why the arrangement of the invention is well-suited for use with wireless measuring sensors, for instance.

BRIEF DESCRIPTION OF THE FIGURES

In the following, the invention will be described by means of preferred embodiments, with reference to the attached drawings in which.

DETAILED DESCRIPTION OF THE INVENTION

Figure 1:
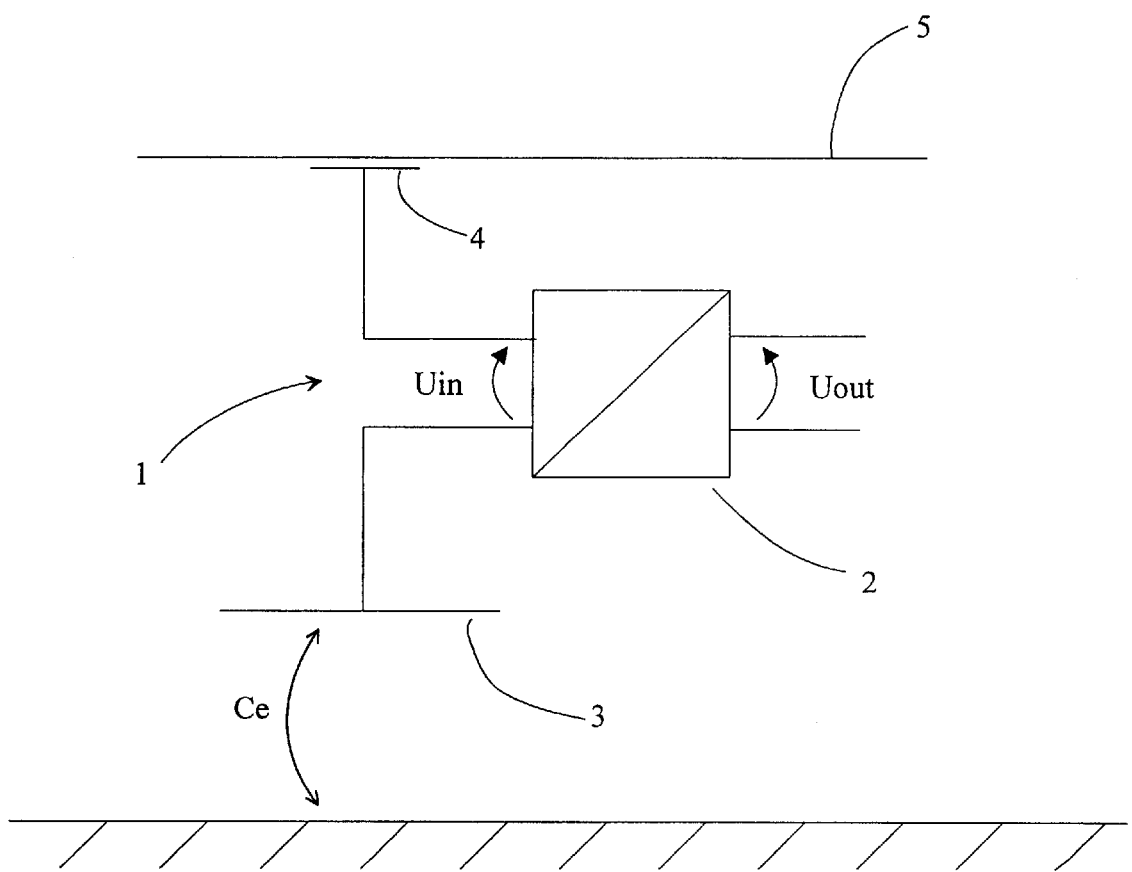
FIG. 1 is a schematic description of the power supply arrangement of the invention.

FIG. 1 shows the power supply arrangement of the invention as a simplified schematic diagram. According to the invention, the power supply arrangement 1 comprises a power supply 2 and a first element 3 and a second element 4 made of an electrically conductive material. These elements are connected to the power supply in such a manner that the power supply receives its supply from the potential difference generated between the elements 3, 4. In FIG. 1, the power supply arrangement of the invention is connected to a medium-voltage conductor 5, whose voltage to ground is typically 6.9 to 21 kV. According to the invention, the arrangement receives its supply from the electric field generated by the conductor 5. By effect of the electric field, an electric resistance is formed in the electrically conductive first element 3 located close to the conductor 5 and insulated both from the ground and the conductor and changes the potential of the element in question. It should be noted that even though the invention is described with reference to medium-voltage conductors, it is also possible to use the invention with high-voltage transmission lines, conductor rails of indoor switch gear and control gear, or the like.

The second electrically conductive element 4 is according to the invention arranged to be capacitively or galvanically connected with the conductor 5. If the element 4 is galvanically connected with the conductor, its potential is exactly the same as that of the conductor. If it is capacitively connected with the conductor, its potential is nearly the same as that of the conductor due to a strong capacitive connection. Thus, a significant potential difference is formed between the first and the second element that can be used as voltage supply to the power supply. The operation of the arrangement can also be described in such a manner that capacitive stray current to ground is increased by increasing the size of the capacitance in relation to the element in a second potential by means of the first element made of conductive material. The size of the current loss determines the amount of energy that can be supplied to the power supply. In a preferred embodiment of the invention, the element in a second potential is ground. The element in question can equally well be a solid object, such as a tree or the like, in ground potential. The element in a second potential can also be another conductor in a three-phase system.

The power supply 2 used in the solution of the invention is for instance a generally known step-down-type power supply, by means of which the high voltage of supply can be changed into a low voltage which can be used in electronic measuring, processing and transmission circuits, for instance. The voltage Uin generated for the power supply, which is according to the invention generated between the first and second element made of an electrically conductive material, is in the range of hundreds of volts. The power supply converts this voltage into a voltage Uout, typically 3 to 5 volts, better suited for electronics.

Figure 2:
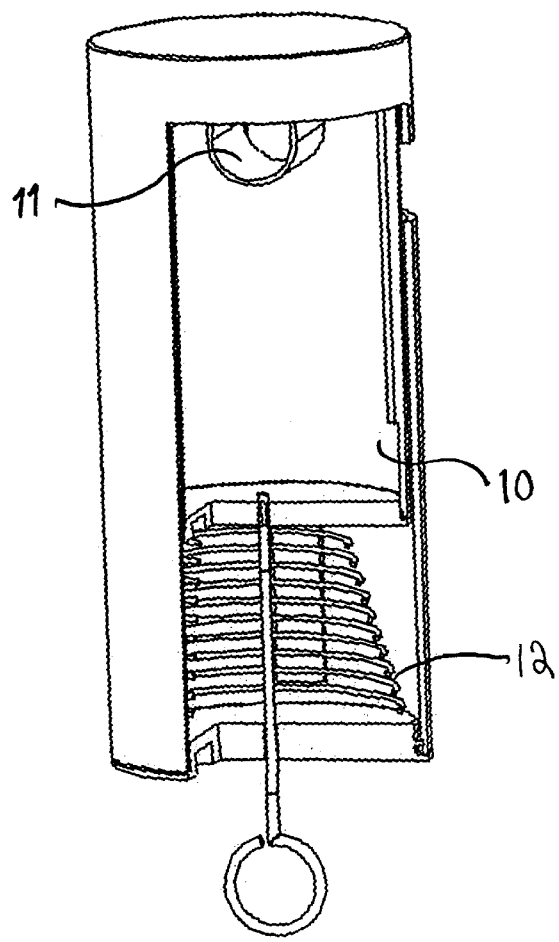
FIG. 2 shows a partial cross-section of an embodiment of the power supply arrangement of the invention.

The power supply arrangement of the invention is most typically used for supplying current for measuring sensors defining the properties of medium-voltage conductors and transmitters transmitting measurement results. For this purpose, one possible mechanical structure of the arrangement is made up by placing the measuring sensors and other electronics inside a substantially cylindrical casing. This type of structure is shown in FIG. 2. For simplicity's sake, the figure only shows some details of the structure and no power supply, for instance, or the location of other electronics. The inner surface 10 of the cylinder shown in the figure is coated with metal, such as copper, and it forms the first element made of an electrically conductive material, the purpose of which is to form a capacitive connection to ground. Research has shown that by this method, it is possible to obtain approximately 5 pF as the value of the capacitance. Even though the capacitance in question charges to a voltage of hundreds of volts, current loss through the capacitance to ground is quite small, which limits the power obtained from the capacitance to the power supply. As already mentioned above, the first electrically conductive element can also form a capacitance to another element in a second potential.

According to the invention, the second element made of electrically conductive material is arranged to have a galvanic or capacitive connection to the conductor for feeding energy to the power supply from the potential difference between said first and second element. This second element is located to the medium-voltage conductor in such a manner that the element is either in direct contact to the conductor or there is an insulating layer between them. Connecting the second element to the conductor is according to an embodiment of the invention done in such a manner that the second element is formed of a metal-coated groove 11 into which the conductor settles tightly. This type of groove is shown in FIG. 2. If a galvanic contact is required between the second element and the conductor, the conductor and said element should be at least partly uninsulated. Galvanic contact is, however, not necessary or the best alternative in all cases, since due to possible differences in the material of the conductor and element, chemical corrosion reactions or other corresponding unwanted phenomena may occur as a result of the electric current or other conditions.

In several cases, medium-voltage conductors are uninsulated open wires, in which case it is necessary to insulate the surface of the second element connected to the conductor. As a result of the insulation, a capacitive connection is formed between the conductor and the element. When the size of the capacitance of this capacitor is in the range of over 100 pF, the coupling is sufficiently big for generating electric power from the potential difference between the first and the second element. The size of the capacitance can be easily increased by increasing the surface area of the element as required.

In a mechanic structure, said groove 11 can be formed in such a manner that the metal-coated groove is under the conductor and presses tightly against the conductor as a result of a springback force provided by a spring 12 and a counter-piece above the conductor.

Figure 3:
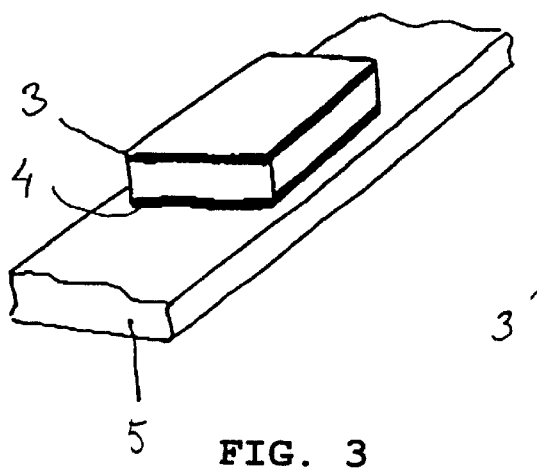
FIGS. 3 and 4 show schematic solutions of some embodiments of the invention.
Figure 4:
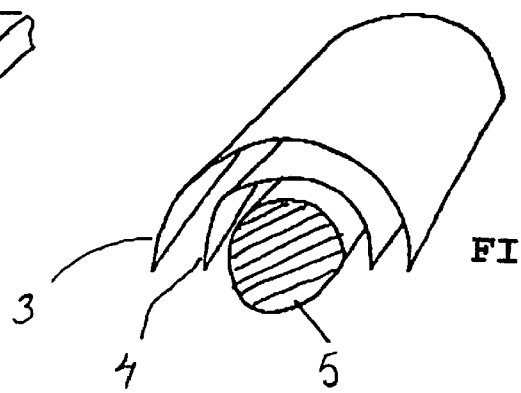

The power supply arrangement of the invention can also be used with conductor rails or conductors of indoor switch gear and control gear. The power supply arrangement can then supply power for instance to measuring sensors and a transmitter transmitting measuring information. FIG. 3 shows how the solution of the invention can be applied to a conductor rail, and FIG. 4 shows how it can be applied to a conductor. In indoor switch gear and control gear, measuring information can, instead of a radio transmitter, be transmitted over optical fibre which provides a galvanic isolation from a high-voltage circuit. With the arrangement of the invention, the power supply of high-voltage measuring sensors or other corresponding devices can be implemented in a simple manner.

Figure 5:
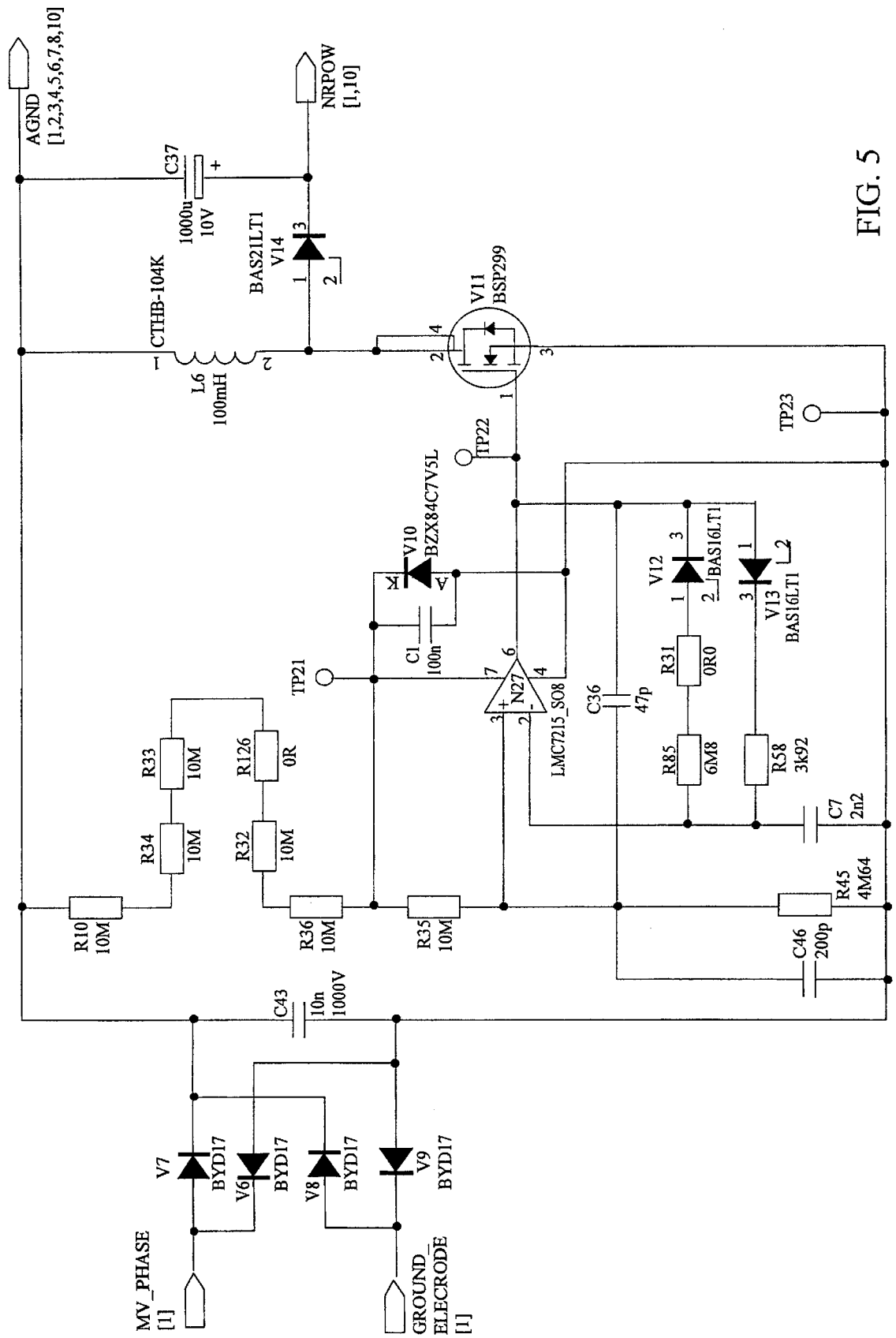
FIG. 5 shows a preferred embodiment of the power supply of the arrangement of the invention.

FIG. 5 shows in more detail the step down-type power supply used in the solution of the invention. The most important characteristic of the power supply is its operation in a reliable and economical manner, since the size of the distributed capacitance formed between the arrangement and ground limits the power obtained for the use of the arrangement. The size of the distributed capacitance is only about 5 pF, which makes possible an approximately 15 to 20 $\mu$A current to run through the capacitance, and consequently, the coupling used in the power supply should be designed to have as low a loss as possible.

A terminal pin MV_PHASE of the coupling shown in FIG. 5 is connected to the medium-voltage conductor galvanically or with a tight capacitive connection, and a terminal pin GROUND_ELECTRODE is connected to the first element made of an electrically conductive material. Energy recovery takes place between said pins using a capacitive connection.

The alternating voltage generated between the poles MV_PHASE and GROUND_ELECTRODE is rectified using a rectifier bridge, which is, as shown in FIG. 5, made up of four avalance diodes V6 to V9, the current loss of which is as small as possible and reverse voltage is over 300 volts. The rectified voltage charges an inlet capacitor C43 and provides a supply voltage to a very low-power comparator N27 which acts as a pulse generator.

The voltage of the capacitor C43 is in the range of 200 volts, and it is fed to the comparator N27 through a 50 M$\Omega$ resistor chain made up of resistors R10, R34, R33, R128, R32 and R36. The pulse ratio of the comparator is adjusted by the components of a feedback loop.

The comparator N27 controls an N-FET switch V11 which has a low gate capacitance. In the conducting state, the switch V11 closes the current loop and allows the energy charged in the capacitor C43 to pass through a coil L6. When the switch V11 is in the blocking state, the current loop is broken and energy is transmitted from the coil L6 to a capacitor C37, the capacitance of which is 1000 $\mu$F in the shown coupling. With the coupling shown in FIG. 5, a voltage of approximately 5 volts is obtained for the capacitor C37. From the capacitor C37, the voltage is provided to the measuring circuits, wireless measuring information transmission circuit and other electronics needing it.

The shown coupling is proven to work with conductors having a voltage between approximately 4 and 50 kV. By changing the sizes of the resistors R85 and R58 of the comparator feedback loop, i.e. by changing the pulse ratio of the comparator, the power supply can also be adjusted to work with higher or lower voltages. As it can be seen from the structure of the power supply, the design is implemented with very low-power and low-loss components. This way, it is possible to make the power supply work. Connected to a 20-kV medium-voltage conductor, the average output power of the power supply is approximately 2 mW.

Due to the limited amount of power obtained capacitively and for the purpose of saving it, it is sensible to use timing in measuring the properties of the conductor and transmitting the measuring information. This can be done by switching off the electronics as far as possible between measuring instances. The processors and the radio transmitter transmitting the measuring information, for instance, are then switched off completely, or put into a energy-saving state. In addition, to save power, it is not necessary to transmit measuring results one by one. Individual measuring instances can follow each other at one-second intervals, for instance, and the measuring information of these instances are collected together to be transmitted at 20 second intervals, for instance, to the processing unit interpreting the measuring results.

Storing energy produced by capacitive methods for momentary use can be done by using a capacitor having a high capacitance. This type of energy-storing capacitor is preferably located on the low-voltage side of the power supply, and the size of its capacitance can be 2.2 F, for instance, which is enough for storing energy for the use described above. Alternatively, a chargeable battery can also be used.

It is obvious to a person skilled in the art that while technology advances, the basic idea of the invention can be implemented in many different ways. The invention and its embodiments are thus not restricted to the examples described above, but can vary within the scope of the claims.

What is claimed is:

1. A power supply arrangement, especially in connection with a conductor of a medium-voltage overhead line, which arrangement comprises a power supply and a first and second element made of an electrically conductive material, which are connected electrically to the power supply for feeding energy to the power supply, wherein said first element is arranged close to the conductor and has a capacitance to an element in a second potential, the capacitance being arranged to charge itself by effect of an electric field generated by the voltage of the medium-voltage conductor, and that said second element is arranged to have a galvanic or capacitive connection with the conductor for feeding energy to the power supply from the potential difference between said first and second elements.

2. A power supply arrangement as claimed in claim 1, wherein said element in a second potential is ground.

3. A power supply arrangement as claimed in claim 1, wherein the first element made of an electrically conductive material is formed by the metal-coated inner surface of a substantially cylindrical object.

4. A power supply arrangement as claimed in claim 1, wherein the second element made of an electrically conductive material is formed of a metal-coated groove, which is arranged in close proximity to the conductor.

5. A power supply arrangement as claimed in claim 3, wherein the second element made of an electrically conductive material is formed of a metal-coated groove, which is arranged in close proximity to the conductor.

6. A power supply arrangement as claimed in claim 4, wherein the metal-coated groove of the second electrically conductive element comprises an insulating layer.

7. A power supply arrangement as claimed in claim 5, wherein the metal-coated groove of the second electrically conductive element comprises an insulating layer.

8. A power supply arrangement as claimed in claim 2, wherein the first element made of an electrically conductive material is formed by the metal-coated inner surface of a substantially cylindrical object.

9. A power supply arrangement as claimed in claim 2, wherein the second element made of an electrically conductive material is formed of a metal-coated groove, which is arranged in close proximity to the conductor.

* * * * *